United States Patent
Oh et al.

(10) Patent No.: US 8,698,971 B2
(45) Date of Patent: Apr. 15, 2014

(54) LIQUID CRYSTAL DISPLAY DEVICE AND METHOD FOR MANUFACTURING THE SAME

(75) Inventors: Kum Mi Oh, Seoul (KR); Han Seok Lee, Seoul (KR); Hee Sun Shin, Paju-si (KR); Won Keun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 137 days.

(21) Appl. No.: 13/208,881

(22) Filed: Aug. 12, 2011

(65) Prior Publication Data
US 2012/0069259 A1    Mar. 22, 2012

(30) Foreign Application Priority Data
Sep. 20, 2010    (KR) .......................... 10-2010-0092378

(51) Int. Cl.
*G02F 1/136*    (2006.01)
(52) U.S. Cl.
USPC .............................................. 349/46; 349/47
(58) Field of Classification Search
None
See application file for complete search history.

(56) References Cited

U.S. PATENT DOCUMENTS

| | | | |
|---|---|---|---|
| 7,808,570 B2 * | 10/2010 | Hotta et al. | 349/47 |
| 7,880,849 B2 * | 2/2011 | Kim et al. | 349/144 |
| 2006/0214168 A1 * | 9/2006 | Akimoto et al. | 257/59 |
| 2008/0131818 A1 * | 6/2008 | Ha et al. | 430/319 |
| 2010/0194707 A1 * | 8/2010 | Hotelling et al. | 345/173 |
| 2012/0068944 A1 * | 3/2012 | Oh et al. | 345/173 |

FOREIGN PATENT DOCUMENTS

| | | | |
|---|---|---|---|
| JP | 2004-264652 A | | 9/2004 |
| JP | 2004264652 A | * | 9/2004 |

* cited by examiner

*Primary Examiner* — Thanh-Nhan P Nguyen
(74) *Attorney, Agent, or Firm* — McKenna Long & Aldridge LLP (57) ABSTRACT

Disclosed is a liquid crystal display device with a built-in touch screen, which facilitates enhanced driving performance, and reduces manufacturing cost by a simplified manufacturing process, and a method for manufacturing the same. The device comprises a first substrate with a plurality of pixel regions defined by gate lines and data lines; an active layer in each pixel region of the first substrate; a gate pattern including a plurality of gate electrodes, a portion of the gate electrodes overlapping with a predetermined portion of the active layer with an insulating layer interposed in-between; a plurality of channel regions in the areas of the active layer overlapped with the plurality of gate electrodes; a plurality of lightly doped drain regions in the active layer and directly adjacent to the plurality of channel regions; and a data electrode electrically connected to the active layer.

13 Claims, 8 Drawing Sheets

| Mask | Layer |
|---|---|
| 1 | Light shield |
| 2 | Active |
| 3 | Gate |
| 4 | ILD & contact |
| 5 | Data (Source/Drain) |
| 6 | PAS0, PAS1 |
| 7 | Vcom |
| 8 | 3rd Metal |
| 9 | PAS2 |
| 10 | Pixel ITO |

| Mask | Layer |
|---|---|
| 1 | Active |
| 2 | Multi Gate |
| 3 | ILD & contact |
| 4 | Data (Source/Drain) |
| 5 | PAS1 |
| 6 | Common |
| 7 | Conductive |
| 8 | PAS2 |
| 9 | Pixel |

LIQUID CRYSTAL DISPLAY DEVICE AND METHOD FOR MANUFACTURING THE SAME

CROSS REFERENCE TO RELATED APPLICATIONS

This application claims the benefit of the Korean Patent Application No. 10-2010-0092378 filed on Sep. 20, 2010, which is hereby incorporated by reference in its entirety as if fully set forth herein.

BACKGROUND

1. Field of the Disclosure

The present disclosure relates to a flat panel display device, and more particularly, a liquid crystal display device with a built-in touch screen, which facilitates enhanced driving performance, and reduced manufacturing cost by simplifying the manufacturing process, and a method for manufacturing the same.

2. Discussion of the Related Art

According to development of various mobile electronic equipment, such as mobile terminals and notebook computers, there is increasing demand for a suitable flat panel display device. The flat panel display device may include an active-matrix liquid crystal display device (LCD), a plasma display panel (PDP), a field emission display device (FED), or a light-emitting diode display device (LED), etc. Among the various flat panel display devices, the LCD device is widely used owing to various advantages, for example, development maturity for mass production, ease of driving, low power consumption, high-quality resolution, and large screen size.

Instead of a related art mouse or keyboard used as an input device to the mobile electronic equipment, a touch screen has been recently used as an input device in conjunction with a flat panel display device, wherein the touch screen enables a user to directly input information by the use of a finger, pen, or stylus.

The touch screen has been widely applied in various fields, for example, mobile terminals for navigation, terminals for industrial use, notebook computers, automatic teller machines (ATM), mobile phones, MP3 players, personal digital assistants (PDA), portable media players (PMP), Play Station Portables (PSP), mobile game machines, digital media broadcasting (DMB) receivers, and tablet personal computers (PC). Touch screens have also been integrated into non-mobile electric appliances such as refrigerators, microwave ovens, and laundry machines. Furthermore, the easy operational method of the touch screen rapidly enlarges the field for applications.

For reducing size of the mobile electronic equipment, an LCD device with a built-in touch screen has been researched and developed. An in-cell touch type LCD device has been developed, wherein the in-cell touch type LCD device refers to an LCD device which uses an element existing in the active structure, for example, a common electrode on a lower substrate, as a touch-sensing electrode.

Figure 1:
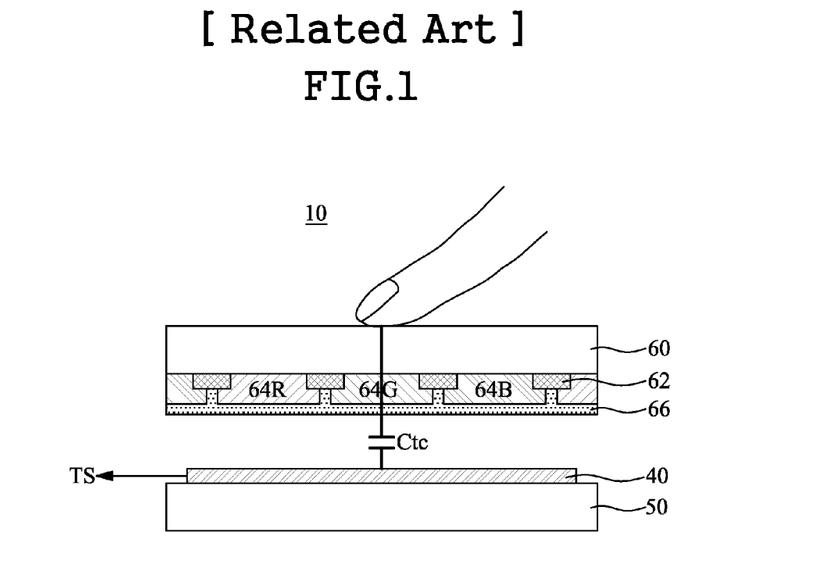
FIG. 1 illustrates an LCD device with a built-in touch screen according to the related art, and a method for manufacturing the same.

FIG. 1 illustrates an LCD device with a built-in touch screen 10 according to the related art. Referring to FIG. 1, the LCD device with a built-in touch screen 10 according to the related art comprises lower and upper substrates 50 and 60, respectively, bonded to each other with a liquid crystal layer (not shown) interposed in between.

As an example of built-in touch screen operation, the pixel array 40 can also be used as a touch screen TS sensor. A small voltage may be applied to the pixel array 40 to create a uniform electrostatic field. When a conductor, such as a human finger or other object, touches the uncoated front surface, a capacitor Ctc is formed. A controller connected to the touch screen TS sensor can determine the location of the touch indirectly from the change in the capacitance as measured from the four corners of the touch screen TS sensor.

On the upper substrate 60, there are a black matrix 62; red, green, and blue color filters 64R, 64G, and 64B; and an overcoat layer 66. In this case, the black matrix 62 defines a pixel region corresponding to each of a plurality of pixels. Also, the red, green, and blue color filters 64R, 64G, and 64B are respectively formed in the respective pixel regions defined by the black matrix 62. The overcoat layer 66 covers the red, green, and blue color filters 64R, 64G, and 64B and the black matrix 62 to planarize the upper substrate 60.

On the lower substrate 50, there is a pixel array 40 including a plurality of pixels to drive the liquid crystal layer and detect a touching point. Each of the pixels is defined by gate lines and data lines which cross each other. At the crossing portion of the gate lines and data lines there is a thin film transistor ('TFT') for each pixel. Each of the pixels also includes a common electrode and a pixel electrode.

Figure 2:
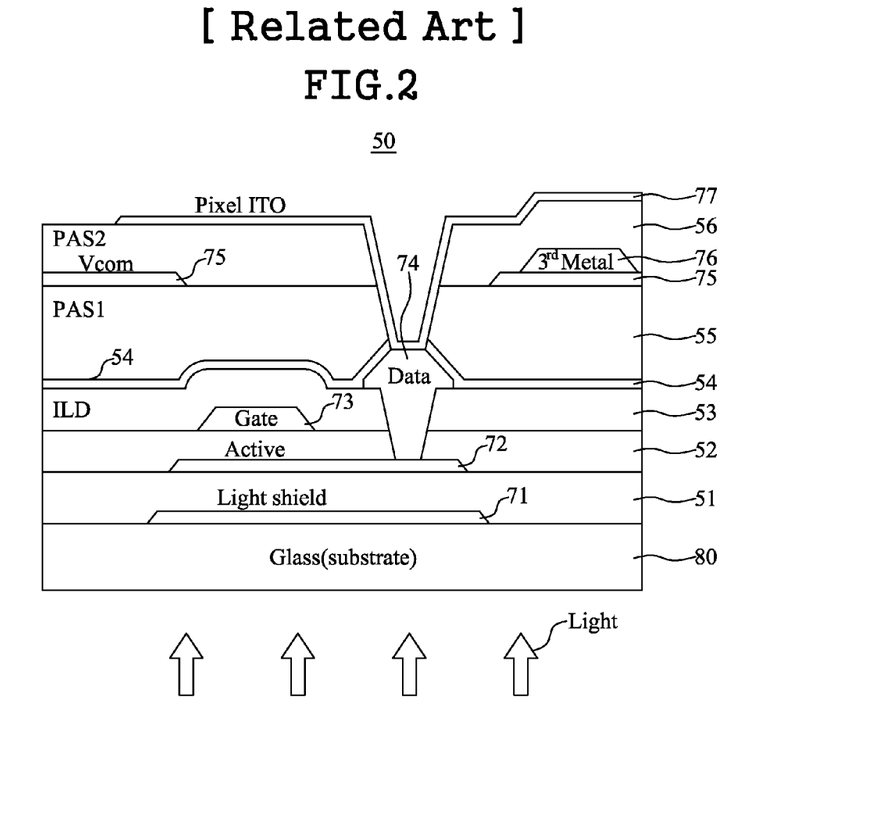
FIG. 2 is a cross section view illustrating a lower substrate in an LCD device with a built-in touch screen according to the related art.

FIG. 2 is a cross sectional view illustrating a lower substrate 50 in the LCD device with a built-in touch screen according to the related art. FIG. 2 shows a lower substrate in a fringe field switch (FFS) mode, which is described in further detail below.

Referring to FIG. 2, each pixel of the lower substrate 50 is formed on a glass substrate 80. Each pixel includes a light-shielding layer 71 to prevent incident light reaching the active layer 72; a buffer layer 51 on the light-shielding layer 71; an active layer 72 on the buffer layer 51; a gate insulating layer 52 on the active layer 72; and a gate electrode 73 of a metal material on the gate insulating layer 52, wherein the gate electrode 73 is partially overlapped with the active layer 72 in that at least a portion of the gate 73 is over some of the active layer 72. Also included are an interlayer dielectric (ILD) 53 and a data electrode (source/drain) 74. The interlayer dielectric 53 is formed on the gate electrode 73, to insulate the gate electrode 73 from the data electrode (source/drain) 74. The data electrode 74 is electrically connected to the active layer 72.

Further, a first contact hole is formed by etching the gate insulating layer 52 and the interlayer dielectric 53, wherein the contact hole exposes a predetermined portion of the active layer 72. The data electrode 74 is formed by burying a metal material in the contact hole to contact the active layer 72. The active layer 72, the gate insulating layer 52, the gate electrode 73, and the data electrode 74 form portions of the TFT.

In each pixel of the lower substrate 50, there are a first passivation layer (PAS0) 54, a second passivation layer (PAS1) 55, a common electrode 75, a conductive line (3$^{rd}$ metal) 76, a third passivation layer (PAS2) 56, and a pixel electrode 77, which are sequentially formed on the interlayer dielectric 53. The first and second passivation layers (PAS0, PAS1) 54 and 55 are formed to cover the gate electrode 73 and the data electrode 74. The common electrode 75 is formed on the second passivation layer 55, wherein the common electrode 75 is formed of a transparent conductive material such as Indium-Tin-Oxide (ITO). The conductive line 76 is formed on and electrically connected with a predetermined portion of the common electrode 75. The third passivation layer 56 is formed to cover the common electrode 75 and the conductive line 76. The pixel electrode 77 is electrically connected with an upper portion of the third passivation layer 56 and the data electrode 74, wherein the pixel electrode 77 is formed of a transparent conductive material such as ITO.

A second contact hole is formed by partially etching the first, second and third passivation layers (PAS0, PAS1, and PAS2) 54, 55 and 56. After etching, the upper portion of the data electrode 74 is exposed via the second contact hole. The pixel electrode 77 is formed inside the second contact hole formed by etching the first, second, and third passivation layers (PAS0, PAS1, PAS2) 54, 55 and 56, whereby the pixel electrode 77 is electrically connected with the data electrode 74.

Herein, the TFT serving as a switching element of the LCD device may be formed in a top gate structure or bottom gate structure. In case of the TFT with the top gate structure, light emitted from the backlight unit is applied to the active layer 72 through the substrate 80, whereby a light leakage current occurs in the active layer 72, and degradation such as crosstalk may arise. Crosstalk is an undesirable visual phenomenon resulting from unintended pixels turning on to image misinformation. The combination of residual gate voltage during the decay time after the gate is turned off plus photonic energy absorbed from the backlight unit may be enough to at least partially turn the TFT on when it is intended to be off.

To prevent such limitations, a metal layer, i.e., the light-shielding layer 71 for shielding light is disposed under the active layer 72. Therefore, light of the backlight is prevented from being irradiated on the active layer 72, and thus leakage current is minimized.

Figure 3:
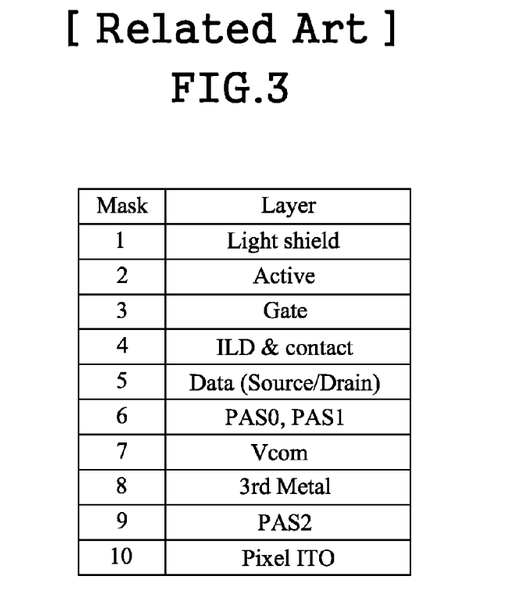
FIG. 3 illustrates a list of mask layers for manufacturing an LCD device with a built-in touch screen according to the related art.

The electron mobility property of amorphous silicon limits the operational speed and the geometric design rules of the TFT. To overcome such limitations, low temperature poly-silicon (LTPS) is being used as a material for forming the active elements (for example, TFT) of the lower substrate 50 because the electron mobility is about 100 times higher than a-Si. Even when LTPS is used as a material for forming the TFT of the lower substrate 50, as shown in FIG. 3, ten (10) masks corresponding to patterned layers are used in a manufacture process, and therefore, a plurality of detailed processes (for example, 155 steps) are performed.

LTPS enables higher resolution display panels as compared to a-Si, and has excellent characteristic for TFT operations. However, LTPS requires the manufacture process to have more masks and detailed processes than a-Si because there are extra annealing steps. Therefore, the price competitiveness is limited and manufacturing efficiency is reduced.

SUMMARY

Accordingly, the present disclosure is directed to an LCD device with a built-in touch screen and a method for manufacturing the same that substantially obviates one or more problems due to limitations and disadvantages of the related art.

An aspect of the present disclosure is to provide an LCD device, which facilitates lower manufacturing cost by reducing the number of masks for a process of forming a lower substrate, and a method for manufacturing the same.

Another aspect of the present disclosure is to provide a thin film transistor structure, which decreases a light leakage current in an active layer of a top gate structure, and a method for manufacturing the same.

Another aspect of the present disclosure is to provide an LCD device, which enhances manufacturing efficiency by simplifying a manufacturing process of a lower substrate, and a method for manufacturing the same.

Another aspect of the present disclosure is to provide an LCD device, which enhances driving performance by using LTPS (Low Temperature Poly Silicon) as the active semiconductor in the TFT.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims as well as the appended drawings.

To achieve these and other advantages and in accordance with the purpose of the disclosure, as embodied and broadly described herein, there is provided an LCD device comprising: a first substrate with a plurality of pixel regions defined by gate lines and data lines; an active layer in each pixel region of the first substrate; a gate pattern including a plurality of gate electrodes, a portion of the gate electrodes overlapping with a predetermined portion of the active layer with an insulating layer interposed in-between; a plurality of channel regions in the areas of the active layer overlapped with the plurality of gate electrodes; a plurality of lightly doped drain regions in the active layer and directly adjacent to the plurality of channel regions; and a data electrode electrically connected to the active layer.

Here, the active layer includes: a plurality of channel regions formed in the regions overlapped with the plurality of gate electrodes; and a plurality of LDD regions formed in the circumference of the plurality of channel regions.

In yet another aspect of the present disclosure, there is provided a method for manufacturing an LCD device comprising: depositing and patterning an active layer of a semiconductor material on a substrate with a plurality of pixel regions defined by gate lines and data lines; coating an insulating layer on the active layer; patterning a gate including a plurality of gate electrodes overlapped with a predetermined portion of the active layer by depositing and patterning a conductive material on the insulating layer; etching a contact hole of a predetermined portion of the insulating layer to expose a predetermined portion of the active layer; patterning a data electrode by burying a conductive material in the contact hole, the data electrode electrically connected to the active layer; creating a plurality of channels by overlapping the active layer with the plurality of gate electrodes with the insulating layer interposed in-between; and lightly doping a plurality of lightly doped drain regions in the active layer that are directly adjacent to the plurality of channels.

Additionally, the process of forming the gate pattern comprises: forming a first gate electrode by the use of gate line; forming a second gate electrode protruding from the first gate electrode, wherein the second gate electrode is formed perpendicular to the first gate electrode; and forming a third gate electrode protruding from the second gate electrode, wherein the third gate electrode is formed perpendicular to the second gate electrode.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Hereinafter, an LCD device with a built-in touch screen according to the present disclosure and a method for manufacturing the same will be described with reference to the accompanying drawings.

For the following description of the embodiments of the present disclosure, if a first structure (for example, electrode, line, layer, contact, and etc.) is described as being formed "on" or "under" a second structure, the first and second structures may come in contact with each other, or there may be a third structure interposed between the first and second structures.

Depending on an alignment mode of liquid crystal layer, an LCD device may be classified into Twisted-Nematic (TN) mode, Vertical-Alignment (VA) mode, In-Plane Switching (IPS) mode, and Fringe Field Switching (FFS) mode. The various modes use different electro-optic characteristics of the liquid crystals to modulate light.

In the cases of the IPS mode and the FFS mode, both a pixel electrode and a common electrode may be formed on a lower substrate, whereby liquid crystal molecules of the liquid crystal layer may be aligned depending on an electric field between the pixel electrode and the common electrode.

Especially, in case of the IPS mode, the pixel electrode and the common electrode may be alternately arranged in parallel so that an In-Plane mode electric field occurs between the pixel electrode and the common electrode, thereby aligning the liquid crystal molecules of the liquid crystal layer.

However, in case of the IPS mode, the liquid crystal molecules may not be properly aligned above the pixel electrode and the common electrode, whereby light transmittance is relatively deteriorated above the pixel electrode and the common electrode.

In order to overcome this problem of the IPS mode, the FFS mode has been proposed. In case of the FFS mode, an insulating layer may be interposed between the pixel electrode and the common electrode. In the FFS mode, any one of the pixel electrode and the common electrode may be formed in a plate shape or pattern, and the other may be formed in a finger shape, whereby a fringe electric field occurs between the pixel electrode and the common electrode. Thus, the liquid crystal molecules of the liquid crystal layer may be aligned by the fringe field occurring between the pixel electrode and the common electrode. Positioning of the liquid crystal molecules can be adjusted by varying the fringe electric field.

The LCD device with a built-in touch screen according to an embodiment of the present disclosure may be formed in the FFS mode. The LCD device with a built-in touch screen according to the embodiment of the present disclosure may comprise an in-cell touch type liquid crystal panel with a built-in touch screen for detection of a user's touch point; a backlight unit for supplying light to the liquid crystal panel; and a driving circuit.

The driving circuit may include a timing controller (T-con), a data driver (D-IC), a gate driver (G-IC), a touch-sensing driver, a backlight driver, and a power supply. The driving circuit may be totally or partially formed in Chip-On-Glass (COG) or Chip-On-Film (COF, Chip On Flexible Printed Circuit).

The liquid crystal panel may include lower and upper substrates bonded to each other with the liquid crystal layer interposed therebetween. Also, a plurality of pixels (Clc) arranged in a matrix configuration may be formed in the liquid crystal panel. The liquid crystal panel may control the transmittance of light passing through the liquid crystal layer in each pixel depending on an input data voltage, to display an image according to a video signal.

Also, the common electrode on the lower substrate may be driven as the sensing electrode to sense the change of capacitance depending on a user's touch, whereby the user's touch point can be detected through the capacitance sensed by the common electrode.

On the upper substrate, there may be a black matrix (BM); red, green, and blue color filters; and an overcoat layer. In this case, the black matrix may define a pixel region corresponding to each of plural pixels. Also, the red, green, and blue color filters may be respectively formed in the respective pixel regions defined by the black matrix. The overcoat layer may cover the red, green, and blue color filters and the black matrix to planarize the upper substrate. On the lower substrate, there may be a pixel array including a plurality of pixels to drive the liquid crystal layer and detect the touching point by sensing the capacitance depending on a user's touch. The pixel array may include a thin film transistor to be described; the common electrode; and a conductive line for connection of the common electrodes in the respective pixels.

A gate line and a data line may be formed on the lower substrate to intersect perpendicularly. A plurality of pixels may be defined by the gate line and the data line. In each of the pixels, a TFT may be formed as a switching element, and a pixel electrode electrically connected with the TFT may be formed in each pixel. Herein, the TFT may include a gate electrode, an active layer (semiconductor layer), an insulating layer, and a data electrode (source/drain electrode). The TFT may have a bottom gate structure where a gate electrode is disposed under an active layer, or have a top gate structure where a gate electrode is disposed on an active layer.

Figure 4:
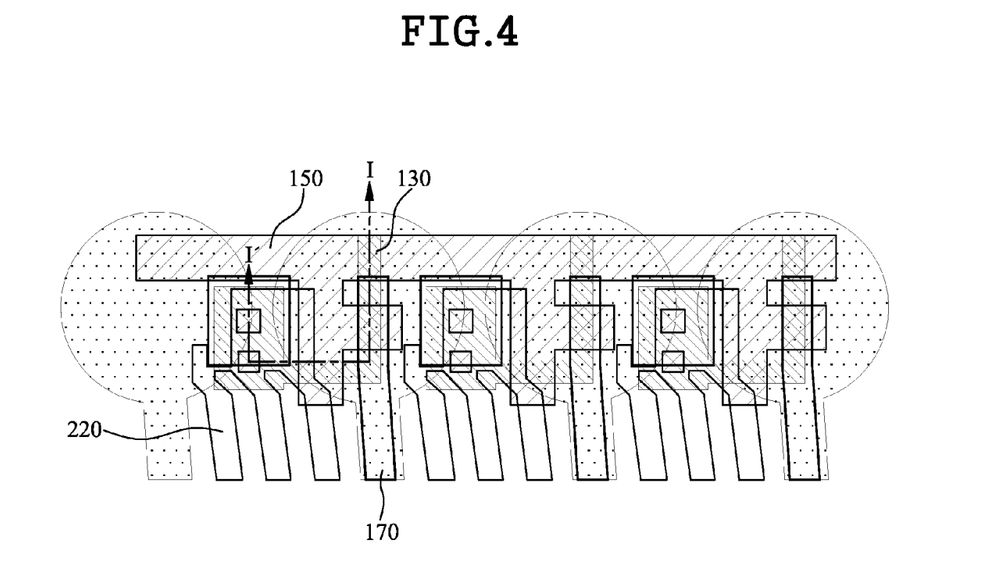
FIG. 4 is a plane view illustrating a lower substrate in an LCD device with a built-in touch screen according to an exemplary embodiment of the present disclosure.
Figure 5:
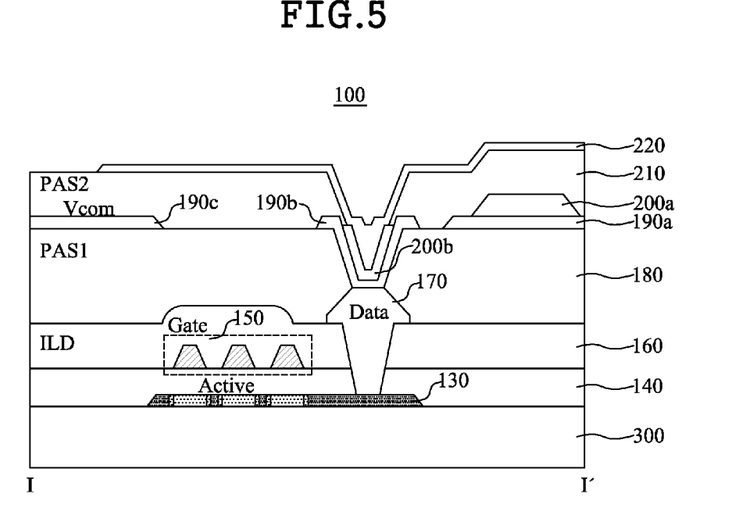
FIG. 5 is a cross sectional view illustrating a lower substrate in an LCD device with a built-in touch screen according to an exemplary embodiment of the present disclosure.

FIG. 4 is a plane view illustrating a lower substrate in an LCD device with a built-in touch screen according to an exemplary embodiment of the present disclosure. FIG. 5 is a cross section view illustrating a lower substrate in an LCD device with a built-in touch screen according to an exemplary embodiment of the present disclosure. FIG. 5 is a cross sectional view along I-I' of FIG. 4.

Referring to FIGS. 4 and 5, a plurality of pixels may be formed on a lower substrate 100. Each of the pixels may include a thin film transistor (TFT) which may comprise a gate pattern 150, an active layer (semiconductor layer) 130, and an insulating layer.

Each pixel may include a pixel electrode 220 which may be connected to the TFT and supply a pixel voltage based on a video signal to the pixel; a common electrode 190a supplying a common voltage (Vcom) to the pixel; and a conductive line 200a connecting the common electrodes 190a of the neighboring pixels. Herein, the conductive line 200a may be formed as a contact line that allows the common electrode 190a to be driven as a touch sensing electrode for detecting touch.

Each pixel of the lower substrate 100 may include a buffer layer (not shown) formed on the substrate 300; an active layer 130 on the buffer layer; a gate insulating layer (GI) 140 on the active layer 130; a gate pattern 150 formed on the gate insulating layer 140 and partially overlapped with the active layer 130; an interlayer dielectric (ILD) 160 for insulating the gate pattern 150 from a data electrode 170, wherein the interlayer dielectric (ILD) 160 may be formed on the gate pattern 150; and the data electrode (source/drain) 170 electrically connected with the active layer 130 which may be partially exposed via a contact hole.

The gate pattern 150 may comprise a plurality of gate electrodes. The plurality of gate electrodes may overlap with the active layer 130 under the circumstance that the gate insulating layer 140 is interposed between the gate electrodes and the active layer 130 to form a plurality of channels.

The contact hole may be formed by etching the gate insulating layer 140 and the interlayer dielectric 160, whereby the predetermined portion of the active layer is exposed via the contact hole.

The data electrode 170 may be formed by burying a conductive material in the contact hole. The data electrode 170 may be electrically connected to the pixel electrode 220 through the common via 190b and the conductive via 200b to be described.

In each pixel of the lower substrate 100, there may be a first passivation layer (PAS1) 180, the common electrode layer 190a, 190b, 190c, and the conductive layer 200a and 200b. The first passivation layer (PAS1) 180 may be formed to cover the gate electrode 150 and the data electrode 170. The common electrode layer 190a, 190b, 190c may be brought into contact with an upper portion of the first passivation layer 180 and the data electrode 170, wherein the common electrode (Vcom) 190c may be formed of a transparent conductive material such as Indium-Tin-Oxide (ITO). The conductive line 200a may be formed on a predetermined portion of the common electrode 190a, and may be electrically connected with the common electrode 190a.

The common via 190b and the conductive via 200b may be sequentially formed inside the first contact hole, as well as on the first passivation layer 180. Thus, the data electrode 170, the common via 190b, and the conductive via 200b may be electrically connected in the first contact hole.

Each pixel of the lower substrate 100 may include a second passivation layer (PAS2) 210 to cover the common electrode layer 190a, 190b, 190c, and the conductive layer 200a, 200b; and a pixel electrode 220 electrically connected with an upper portion of the second passivation layer 210 and the data electrode 170, wherein the pixel electrode 220 may be formed of a transparent conductive material, for example, indium-tin-oxide (ITO), indium-zinc-oxide (IZO), etc.

A second contact hole may be formed by partially etching the second passivation layer 210 to expose the conductive via 200b. Then, the pixel electrode 220 may be formed inside the second contact hole, and may be electrically connected with the conductive via 200b. Thus, the pixel electrode 220 may be electrically connected with the data line 170 via the common via 190b and the conductive via 200b.

In the LCD device with a built-in touch screen according to an embodiment of the present disclosure, during a display period of an image frame, a data voltage may be supplied to the pixel electrode 220, and a common voltage (Vcom) may be supplied to the Vcom electrode 190c creating a voltage potential which modulates the liquid crystal material to display an image element.

During a non-display period of an image frame, the common electrode 190a formed in each pixel and connected to the conductive line 200a may be driven as the touch-sensing electrode, to detect the change of capacitance (Ctc) depending on the user's touch. For this, the Vcom electrode 190c may supply the common voltage (Vcom) to the pixel during a display period of an image frame, and the common electrode 190a may be driven as the touch-sensing electrode to detect the user's touch during a non-display period of the frame.

The common via 190b and the conductive via 200b formed in the first contact hole for exposing the upper portion of the data electrode 170 may be used for contact between the data electrode 170 and the pixel electrode 220. Thus, although part of the common electrode layer, the common via 190b formed in the first contact hole may be electrically insulated from the Vcom electrode 190c and common electrode 190a formed on the first passivation layer 180. The common voltage is not additionally supplied to the common via 190b formed inside the first contact hole. Meanwhile, the common voltage is supplied to the Vcom electrode 190c, formed on the first passivation layer 180, during the display period.

The above LCD device with a built-in touch screen according to an embodiment may include a TFT with the top gate structure. However, there may not be an additional light-shielding layer for shielding light incident on the active layer 130.

Figure 6:
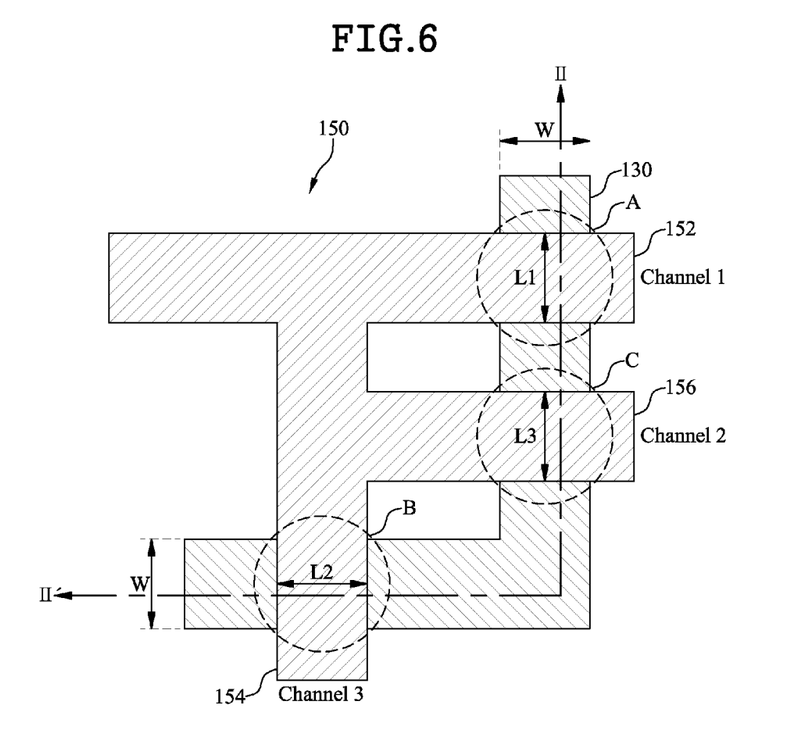
FIG. 6 is a plane view illustrating a gate pattern and an active layer in an LCD device with a built-in touch screen according to an exemplary embodiment of the present disclosure.
Figure 7:
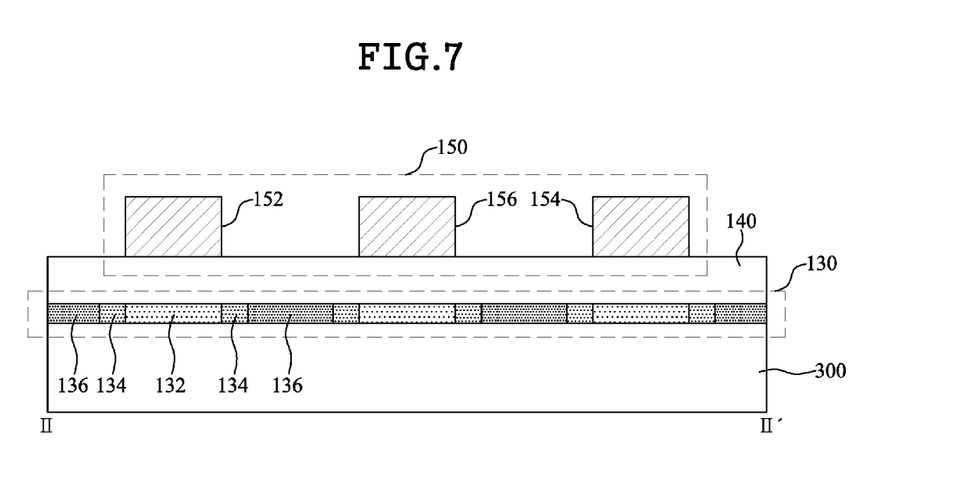
FIG. 7 is a cross sectional view illustrating a gate pattern and an active layer in an LCD device with a built-in touch screen according to an exemplary embodiment of the present disclosure.

FIG. 6 is a plane view illustrating a gate pattern and an active layer in an LCD device with a built-in touch screen according to an exemplary embodiment. FIG. 7 is a cross section view illustrating a gate pattern and an active layer in an LCD device with a built-in touch screen according to an exemplary embodiment. FIG. 7 is a cross section view along II-II' of FIG. 6.

Referring to FIGS. 6 and 7, the gate pattern 150 may include the plurality of gate electrodes 152, 154, and 156.

The plurality of gate electrodes 152, 154, and 156 may overlap with the active layer 130 under the circumstance that the gate insulating layer 140 may be interposed between the two layer to form a plurality of channels (channel 1~channel 3). That is, a channel is a portion of the active layer 130 in which charge carries flow. As shown in FIG. 6, the channels may be respectively formed in A, B, and C regions where the active layer 130 overlaps with the gate electrodes 152, 154, and 156. Although not shown, the plurality of gate electrodes 152, 154, and 156 may be formed in the regions corresponding to the black matrix (BM) of the upper substrate, so that these features may not increase the size of the pixel.

The first gate electrode 152 of the gate pattern 150 may be formed by the use of gate line. The first channel (channel 1) may be formed at the overlap portion between the first gate electrode 152 and the active layer 130.

The second gate electrode 154 may be perpendicular to the first gate electrode 152. That is, when the first gate electrode 152 is formed in a horizontal direction (gate line direction), the second gate electrode 154 may be formed in a vertical direction (data line direction). The third gate electrode 156 may be formed in the same direction as the first gate electrode 152, that is, horizontal direction (gate line direction). The third gate electrode 156 may then be perpendicular to the second gate electrode 154.

In order to minimize leakage current and cross talk, and improve driving reliability of data getting to the intended pixel, as shown in FIG. 7, a plurality of LDD (lightly doped drain) regions 134 and channels 132 are formed in the active layer 130. For example, the channels may be formed in the regions where the active layer 130 overlaps with the gate electrodes 152, 154, and 156. At both sides of each of the channels 132, there may be the LDD regions 134 (for example, n$^-$ doped region). The LDD regions minimize leakage current by reducing the electric field intensity near the drain region. Except the channels 132 and the LDD regions 134, there are heavily doped regions 136 (for example, n$^+$ doped region).

In the LCD device according to the present embodiment, there may be no light-shielding layer for shielding the light incident on the active layer 130. Instead, the plurality of channels 132 and LDD regions 134 for preventing the leakage current may be formed in the active layer 130 so that it is possible to prevent leakage current in the active layer 130 without any additional light-shielding means.

The channels, which may be formed at the regions where the active layer 130 overlaps with the gate electrodes 152, 154, and 156, may vary in geometry depending on the pixel design. For example, the channels may be determined by adjusting a width (W) of the active layer 130 and widths (L1, L2, L3) of the gate electrodes.

In the above LCD device with a built-in touch screen according to an embodiment, the plurality of channels 132 and LDD regions 134 may be formed through the use of an active layer 130 and a plurality of gate electrodes 152, 154, and 156, whereby an entire size of the LDD region is relatively increased as compared to the related art. Thus, it is possible to prevent the leakage current in the active layer 130 without an additional light shielding layer.

For the above explanation with reference to the accompanying drawings, the three channels and plural LDD regions are formed through the use of first to third gate electrodes 152, 154, and 156. However, it shows the exemplary case, but it is not limited to this structure.

Figure 8:
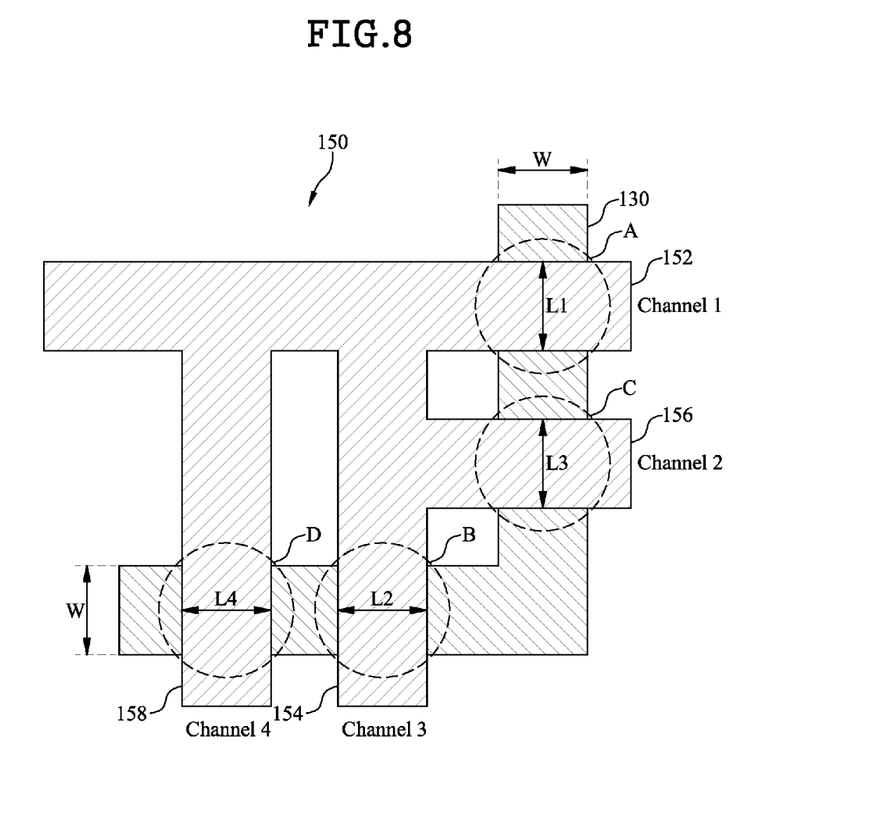
FIG. 8 is a plane view illustrating a gate pattern and an active layer in an LCD device with a built-in touch screen according to another exemplary embodiment of the present disclosure.
Figure 9:
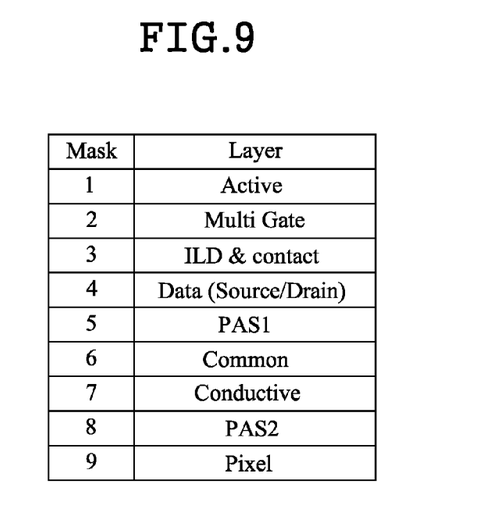
FIGS. 9 to 13 illustrate a method for manufacturing an LCD device with a built-in touch screen according to an exemplary embodiment of the present disclosure.

According to another embodiment, as shown in FIG. 8, the gate pattern 150 may comprise an additional gate electrode 158 to include four gate electrodes. In this configuration, the gate electrodes 152, 154, and 156 shown in FIG. 8 are the same as those of FIG. 6. The gate electrode 158 may protrude from gate electrode 152. A channel (channel 4) may be formed at an overlap portion between the gate electrode 158 and the active layer 130. The gate electrode 158 may protrude perpendicularly from gate electrode 152, thereby forming a 'T' shape by the first and fourth gate electrodes 152 and 158.

As shown in FIG. 8, if the gate pattern 150 may include four gate electrodes, the first to fourth channels (channel 1~channel 4) may be formed so that the entire LDD region is increased to prevent leakage current without the additional layer for shielding the light incident on the active layer 130.

FIGS. 9 to 13 illustrate a method for manufacturing an LCD device with a built-in touch screen according to an embodiment. As shown, FIGS. 10 to 13 are respectively cross section views along I-I' of FIG. 4 and II-II' of FIG. 6.

In the method for manufacturing the LCD device with a built-in touch screen according to an embodiment, a process for forming the additional light-shielding layer for shielding the light under the active layer is omitted, and the TFT may be formed with a plurality of gate electrodes. Therefore, the present disclosure reduces the number of masks as compared to the related art process used for forming the light-shielding layer, thereby decreasing process cost. Also, the present disclosure may increase the LDD region to prevent leakage current without reducing the pixel aperture ratio.

Figure 10:
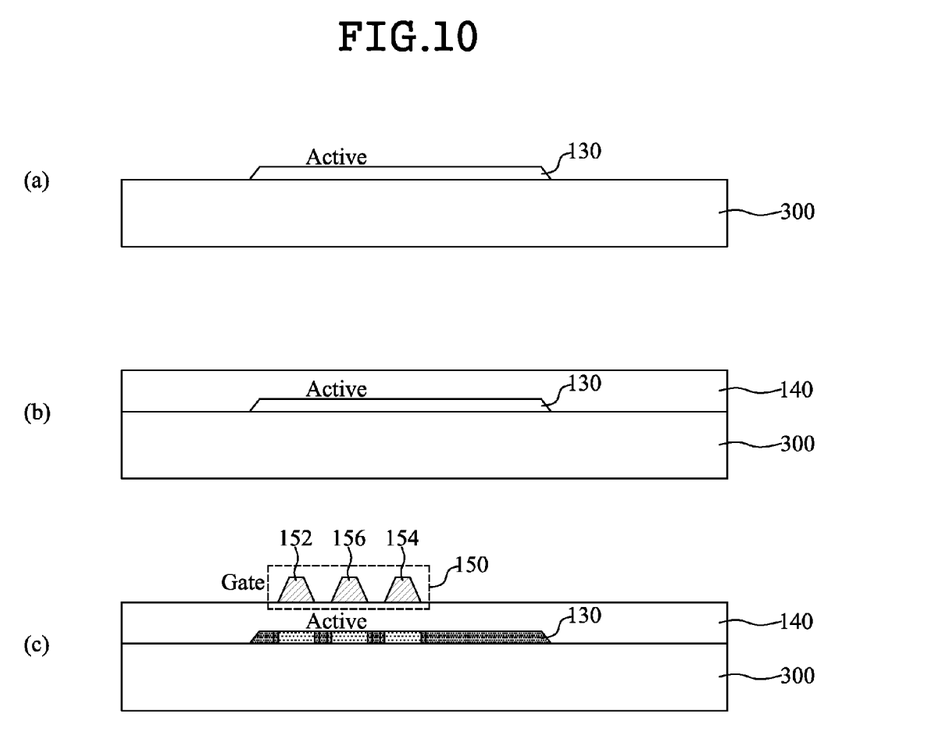

In more detail, as shown in FIG. 10(*a*), an active layer 130 may be formed by depositing a semiconductor such as LTPS on the substrate 300, and may then be patterned by photolithography and etching processes using a mask. The substrate 300 may be transparent glass or plastic. As shown in FIG. 10(*b*), a gate insulating layer 140 may be formed by depositing TEOS (Tetra Ethyl Ortho Silicate), MTO (Middle Temperature Oxide) or other suitable insulating material on an entire surface of the substrate by CVD (Chemical Vapor Deposition) or other appropriate process.

As shown in FIG. 10(*c*), a conductive material may be deposited on the gate insulating layer 140 while being overlapped with the active layer 130. Then, photolithography and etching processes using a mask may be applied to the deposited conductive material to form a gate pattern 150. The gate pattern 150 may include a plurality of gate electrodes 152, 154, and 156. Under the circumstance that a mask and photoresist pattern (hereinafter, referred to as 'PR pattern') are used to form the plurality of gate electrodes 152, 154, and 156, the lightly doped regions (LDD) may be formed in the predetermined portions at both sides of the channel of the active layer 130, as described below. Simultaneously, the heavily doped regions may be formed in the other regions except the channel regions and the LDD regions, as also described below.

Although not shown, a plurality of gate electrodes 152, 154, and 156 may be formed in the regions corresponding to the black matrix (BM) of the upper substrate, whereby there is no influence on the aperture ratio of the pixel.

Figure 11:
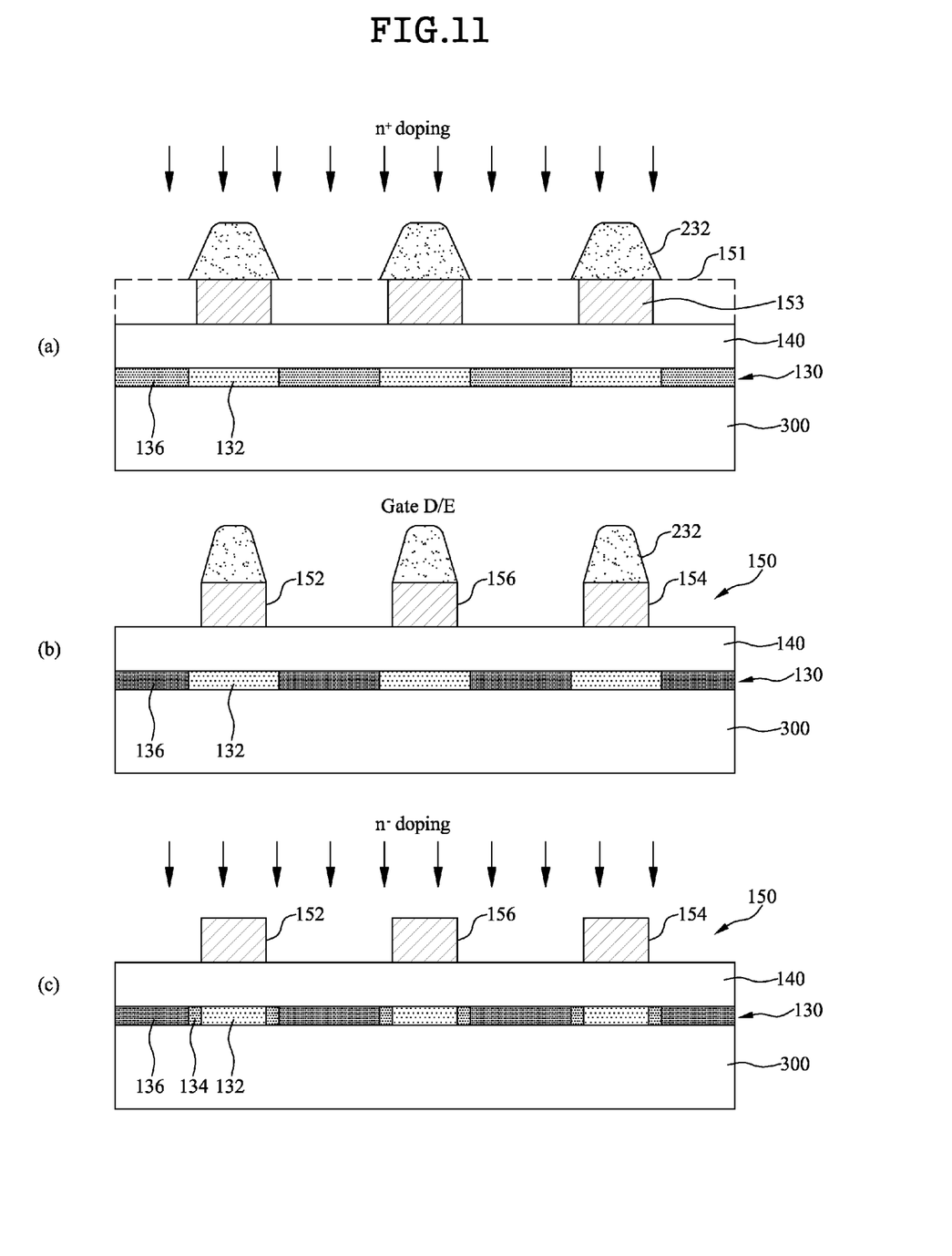

A detailed method for forming the gate pattern 150 and LDD region will be described with reference to FIG. 11. As shown in FIG. 11(*a*), a conductive material may be deposited on the gate insulating layer 140 while being overlapped with the active layer 130 to form a conductive layer 151. Then, photolithography and etching processes using a PR pattern 232 as a mask may be carried out to form a plurality of conductive patterns 153.

Under the circumstance that the PR pattern 232 remaining on the plurality of conductive patterns 153 is used as a mask, the heavily doped regions (n$^+$ doped region) 136 may be formed by heavily doping the active layer 130 with n-type dopant. According to another embodiment of the present disclosure, the active layer may be doped with p-type dopant.

As shown in FIG. 11(*b*), a plurality of gate electrodes 152, 154, and 156 may be formed by removing the remaining PR pattern 232 from the plurality of conductive patterns 153, and etching the conductive patterns.

As shown in FIG. 11(c), in the case that the plurality of gate electrodes 152, 154, and 156 are used as a mask, the active layer 130 may be lightly doped with n-type dopant to form an n⁻ doped region. In this way, the channels 132 may be formed at the regions where the active layer 130 overlaps with the plurality of gate electrodes 152, 154, and 156. At both sides of each of the respective channels 132 there may be LDD regions 134, for example, n⁻ doped region.

Through the aforementioned manufacturing process, the plurality of gate electrodes 152, 154, and 156 may be formed in the gate pattern 150, and the plurality of LDD regions 134 may be formed in the active layer 130.

Figure 12:
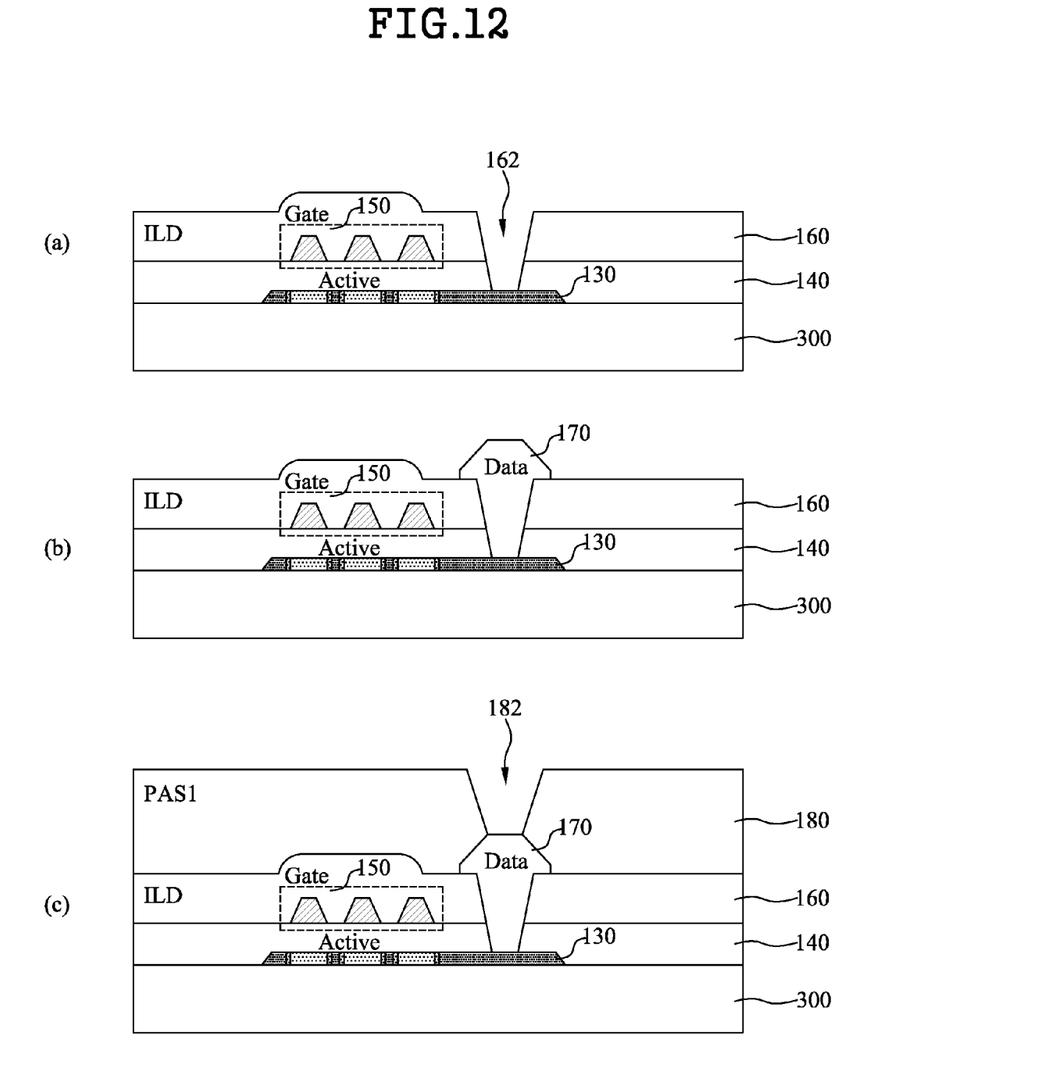

As shown in FIG. 12(a), an insulating material may be deposited on the substrate to cover the gate pattern 150 and the gate insulating layer 140 to form an interlayer dielectric (ILD) 160 for insulating the gate pattern 150 from other elements of the lower substrate. Then, photolithography and etching processes may be carried out to form the contact hole 162 for exposing the predetermined portion of the upper surface of the active layer 130.

As shown in FIG. 12(b), a conductive material may be deposited (buried) on the entire surface of the ILD layer 160 and inside the contact hole 162, and then formed into a data electrode 170 using photolithography and etching processes. Inside the contact hole 162, the data electrode 170 is electrically connected with the active layer 130.

As shown in FIG. 12(c), the first passivation layer (PAS1) 180 may be formed to cover the interlayer dielectric 160 and the data electrode 170, and then photolithography and etching processes using a mask may be carried out to form the first contact hole 182 for exposing the data electrode 170.

Figure 13:
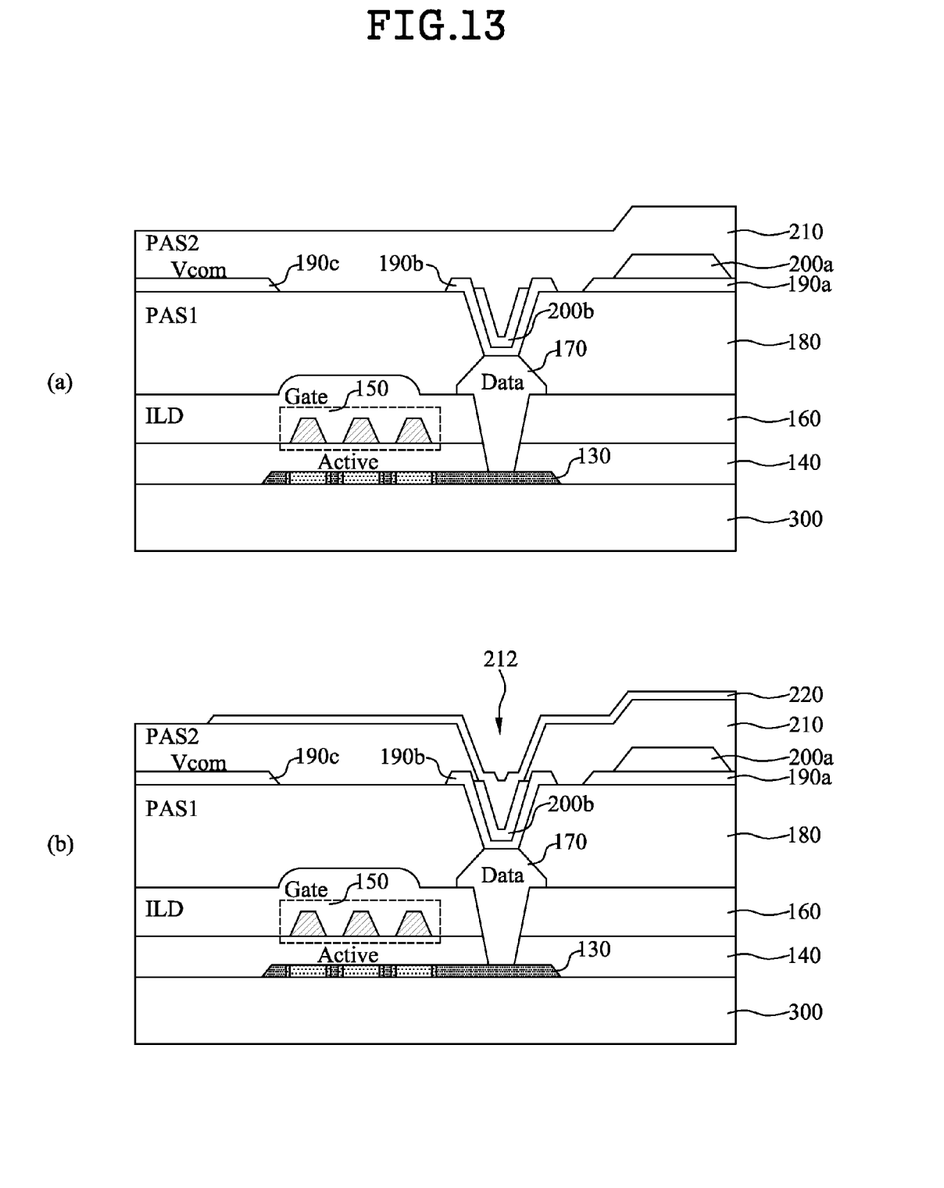

As shown in FIG. 13(a), a transparent conductive material such as ITO may be deposited on the first passivation layer (PAS1) 180 and inside the first contact hole 182, and is then patterned by photolithography and etching processes using a mask. Thus, a common electrode layer 190a, 190b, 190c may be formed on the predetermined portion of the first passivation layer (PAS1) 180 and inside the first contact hole 182. Then, a conductive material may be deposited on the first passivation layer (PAS1) 180 and the common electrode layer 190a, 190b, 190c, and then photolithography and etching processes using a mask may be carried out to form the conductive layer 200a, 200b on the predetermined portion of the common electrode layer 190a, 190b, 190c and inside the first contact hole 182. Thus, the common via 190b is electrically connected with the conductive via 200b.

The second passivation layer (PAS2) 210 may be formed to cover the common electrode layer 190a, 190b, 190c and the conductive layer 200a, 200b. As shown in FIG. 13(b), photolithography and etching processes using a mask may be carried out to form the second contact hole 212 in the predetermined portion of the second passivation layer (PAS2) 210. In this case, the second contact hole 212 may be formed in the region corresponding to the data electrode 170. Also, the conductive via 200b electrically connected with the data electrode 170 may be exposed via the second contact hole 212.

After that, a transparent conductive material such as ITO may be formed on the second passivation layer (PAS2) 210 and inside the second contact hole 212 to form a pixel electrode 220. Inside the second contact hole 212, the pixel electrode 220 may be electrically connected with the conductive via 200b. Thus, the data electrode 170 is electrically connected with the pixel electrode 220 via the common via 190b and the conductive via 200b formed inside the first contact hole 182. Thus, the common voltage (Vcom) is not supplied to the common via 190b formed inside the first contact hole 182.

The method of manufacturing the LCD device according to the above embodiment removes the need for a light-shielding layer for shielding the light incident on the active layer 130, and thus can decrease one mask compared to the related art. Moreover, the method can reduce the processing by about 12.2% relative to the related art (for example, reduce 155 steps to 136 steps). Accordingly, manufacturing costs can be saved and manufacturing efficiency can be enhanced.

The LCD device and the manufacturing method according to the above embodiment uses LTPS as the active material on the lower substrate 300 to improve driving performance.

In the above description, the TFT structure is applied to the LCD device with built-in touch screen, which merely illustrates an example. The structure of the TFT including the gate pattern and the active layer of FIGS. 6 to 8 may be applied to display devices other than LCD devices which use a TFT as a switching or driving element.

It will be apparent to those skilled in the art that modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An LCD device comprising:
    a first substrate with a plurality of pixel regions defined by gate lines and data lines;
    an active layer in each pixel region of the first substrate;
    a gate pattern including a plurality of gate electrodes, a portion of the gate electrodes overlapping with a predetermined portion of the active layer with an insulating layer interposed in-between;
    a plurality of channel regions in the areas of the active layer overlapped with the plurality of gate electrodes;
    a plurality of lightly doped drain regions in the active layer and directly adjacent to the plurality of channel regions;
    a data electrode electrically connected to the active layer;
    a first passivation layer to cover the data electrode;
    a common electrode on the first passivation layer;
    a conductive line on the common electrode;
    a first contact hole formed by etching a predetermined portion of the first passivation layer, the first contact hole for exposing the data electrode;
    a common via inside the first contact hole;
    a conductive via inside the first contact hole, wherein the conductive via is formed on the common via;
    a second passivation layer on the common electrode and the conductive line;
    a second contact hole formed by etching a predetermined portion of the second passivation layer, the second contact hole for exposing the conductive via corresponding to the data electrode; and
    a pixel electrode on the second passivation layer and inside the second contact hole, the pixel electrode electrically connected with the conductive via.

2. The LCD device according to claim 1, wherein the plurality of gate electrodes include:
    a first gate electrode;
    a second gate electrode protruding from the first gate electrode; and
    a third gate electrode protruding from the second gate electrode.

3. The LCD device according to claim 2,
    wherein the second gate electrode is oriented perpendicular to the first gate electrode, and wherein the third gate electrode is oriented in a same direction as the first gate electrode and is also oriented perpendicular to the second gate electrode.

4. The LCD device according to claim 3, wherein the plurality of gate electrodes further include a fourth gate electrode which is oriented in a same direction as the second gate electrode and is oriented perpendicular to the third gate electrode.

5. The LCD device according to claim 1, wherein the data electrode and the pixel electrode are electrically connected with each other via the common electrode layer and the conductive layer inside the first contact hole.

6. The LCD device according to claim 5, further comprising:
- a second substrate;
- a layer of liquid crystal;
- an in-cell type touch-sensing electrode.

7. A method for manufacturing an LCD device comprising:
- depositing and patterning an active layer of a semiconductor material on a substrate with a plurality of pixel regions defined by gate lines and data lines;
- coating an insulating layer on the active layer;
- patterning a gate including a plurality of gate electrodes overlapped with a predetermined portion of the active layer by depositing and patterning a conductive material on the insulating layer;
- etching a contact hole of a predetermined portion of the insulating layer to expose a predetermined portion of the active layer;
- patterning a data electrode by burying a conductive material in the contact hole, the data electrode electrically connected to the active layer;
- creating a plurality of channels by overlapping the active layer with the plurality of gate electrodes with the insulating layer interposed in-between;
- lightly doping a plurality of lightly doped drain regions in the active layer that are directly adjacent to the plurality of channels;
- coating a first passivation layer on the data electrode;
- forming a common electrode on the first passivation;
- forming a conductive line on the common electrode;
- etching a predetermined portion of the first passivation layer to form a first contact hole for exposing the data electrode;
- depositing a common via in the first contact hole;
- depositing a conductive via in the first contact hole;
- wherein the common via is electrically connected to the conductive via;
- coating a second passivation layer on the common electrode and the conductive line, and etching a predetermined portion of the second passivation layer to form a second contact hole for exposing a predetermined portion of the conductive via corresponding to the data electrode; and
- depositing a pixel electrode on the second passivation layer and inside the second contact hole, the pixel electrode electrically connected to the conductive via.

8. The method according to claim 7, wherein the process of patterning the gate electrodes comprises:
- patterning a first gate electrode;
- patterning a second gate electrode protruding from the first gate electrode, wherein the second gate electrode is formed perpendicular to the first gate electrode; and
- patterning a third gate electrode protruding from the second gate electrode, wherein the third gate electrode is formed perpendicular to the second gate electrode.

9. The method according to claim 8, further comprising patterning a fourth gate electrode protruding from the first gate electrode, wherein the fourth gate electrode is in the same direction as the second gate electrode, and is perpendicular to the third gate electrode.

10. The method according to claim 7, wherein the process of patterning the gate electrodes comprises forming a plurality of lightly doped drain regions in the active layer using the plurality of gate electrodes as a mask.

11. The method according to claim 7, wherein the data electrode and the pixel electrode are electrically connected with each other via the common electrode layer and the conductive layer formed inside the first contact hole.

12. The method according to claim 7, wherein a thin film transistor is formed of Low Temperature Poly Silicon.

13. The method according to claim 7, further comprising:
- patterning the conductive layer to form a conductive electrode; and
- connecting a touch screen controller to the conductive electrode.

* * * * *